United States Patent
Long

(10) Patent No.: US 9,239,361 B2
(45) Date of Patent: Jan. 19, 2016

(54) SYSTEM AND METHOD FOR POWERING AND MONITORING AN AUTOMATED BATTERY POWERED DISPENSER

(75) Inventor: Avery Dallas Long, Madison, AL (US)

(73) Assignee: Proventix Systems, Inc., Birmingham, AL (US)

( * ) Notice: Subject to any disclaimer, the term of this patent is extended or adjusted under 35 U.S.C. 154(b) by 0 days.

(21) Appl. No.: 14/235,336

(22) PCT Filed: Jun. 22, 2012

(86) PCT No.: PCT/US2012/043798
§ 371 (c)(1),
(2), (4) Date: Jan. 27, 2014

(87) PCT Pub. No.: WO2012/178045
PCT Pub. Date: Dec. 27, 2012

(65) Prior Publication Data
US 2014/0191726 A1    Jul. 10, 2014

Related U.S. Application Data

(60) Provisional application No. 61/500,457, filed on Jun. 23, 2011.

(51) Int. Cl.
*H02J 7/00* (2006.01)
*H02J 7/14* (2006.01)
(Continued)

(52) U.S. Cl.
CPC .............. *G01R 31/36* (2013.01); *A47K 5/1217* (2013.01); *H02J 7/0068* (2013.01); *H01M 2/1055* (2013.01); *H01M 10/42* (2013.01); *H02J 3/32* (2013.01); *H02J 9/061* (2013.01)

(58) Field of Classification Search
USPC ......... 320/112, 128, 106, 107, 116, 127, 132, 320/134, 136; 429/10, 96, 99, 100, 121, 429/142, 157, 97; 307/66, 52, 64, 65, 89; 439/38, 500, 754
See application file for complete search history.

(56) References Cited

U.S. PATENT DOCUMENTS

| | | |
|---|---|---|
| 4,946,070 A | 8/1990 | Albert et al. |
| 4,967,935 A | 11/1990 | Celest |

(Continued)

OTHER PUBLICATIONS

Park, Keun Young "International Search Report and Written Opinion of the International Searching Authority—PCT/US2012/043798" Jan. 7, 2013; pp. 1-9.

*Primary Examiner* — Edward Tso
*Assistant Examiner* — Alexis A Boateng
(74) *Attorney, Agent, or Firm* — Edward H Kiessling, IV

(57) ABSTRACT

A system and method for powering and monitoring use of battery powered automated dispensers is provided. In one embodiment, a pseudo battery assembly comprised of a pseudo battery and a plurality of battery spacers powers and monitors use of an automated hand hygiene dispenser. More specifically, the pseudo battery receives an external power supply from a control unit that is part of a hand hygiene compliance (HHC) system, wherein the pseudo battery is operable to distribute the power to the dispenser and detect use thereof with a sensor. Further, a feedback device associated with the control unit is operable to display an alarm or notification once the dispenser has been used a predetermined amount of times. In other embodiments, the pseudo battery assembly powers and monitors use of battery powered automated dispensers, such as an automated towel dispenser or an automated gloves dispenser.

13 Claims, 4 Drawing Sheets

(51) Int. Cl.
  *G01R 31/36* (2006.01)
  *A47K 5/12* (2006.01)
  *H02J 9/06* (2006.01)
  *H01M 2/10* (2006.01)
  *H01M 10/42* (2006.01)
  *H02J 3/32* (2006.01)

(56) References Cited

U.S. PATENT DOCUMENTS

| | | | | |
|---|---|---|---|---|
| 5,277,993 A * | 1/1994 | Landers | | 429/10 |
| 6,074,778 A * | 6/2000 | Stagakis | | 429/99 |
| 6,105,898 A | 8/2000 | Byrd et al. | | |
| 6,285,178 B1 * | 9/2001 | Ball et al. | | 323/351 |
| 6,956,498 B1 | 10/2005 | Gauthier et al. | | |
| 7,296,765 B2 | 11/2007 | Rodrian | | |
| 7,766,194 B2 | 8/2010 | Boll et al. | | |
| 7,794,272 B1 * | 9/2010 | Hiatt et al. | | 439/500 |
| 7,855,651 B2 | 12/2010 | LeBlond et al. | | |
| 8,094,029 B2 | 1/2012 | LeBlond et al. | | |
| 2001/0035735 A1 * | 11/2001 | Fukuoka et al. | | 320/112 |
| 2002/0175182 A1 | 11/2002 | Matthews | | |
| 2004/0083547 A1 * | 5/2004 | Mercier | | 4/623 |
| 2006/0175341 A1 | 8/2006 | Rodrian | | |
| 2008/0018302 A1 | 1/2008 | Reinsel | | |
| 2008/0185399 A1 * | 8/2008 | Yang et al. | | 222/52 |
| 2010/0237096 A1 * | 9/2010 | Wegelin | | 222/52 |
| 2010/0315244 A1 | 12/2010 | Tokhtuev et al. | | |
| 2010/0320227 A1 * | 12/2010 | Reynolds | | 222/52 |
| 2011/0017778 A1 * | 1/2011 | Kadiks et al. | | 222/190 |
| 2011/0140667 A1 * | 6/2011 | Moon | | 320/134 |

* cited by examiner

SYSTEM AND METHOD FOR POWERING AND MONITORING AN AUTOMATED BATTERY POWERED DISPENSER

CROSS REFERENCE TO RELATED APPLICATIONS

This application is a national stage under 35 U.S.C. 371 of International Application PCT/US2012/043798. International Application PCT/US2012/043798 cites the priority of U.S. Provisional Patent Application No. 61/500,457, filed Jun. 23, 2011.

TECHNICAL FIELD

The present disclosure relates to the use of a hand hygiene compliance (HHC) system in conjunction with a pseudo battery assembly to power and monitor device utilization of battery powered automated dispensers.

BACKGROUND ART

Within the healthcare industry, infection control experts recognize the importance of preventing the spread of healthcare-acquired infections. To date many studies have been conducted in an effort to ascertain effective ways to reduce the occurrence of such infections, and the clear majority finds a thorough cleansing of one's hands as the single most important way to protect against the spread of healthcare-acquired infections. For this reason, many health care facilities have installed manual and battery powered automated dispensers to facilitate proper hand hygiene.

However, limitations exist with regard to these manual and automated dispensers. For instance, manual dispensers require users make physical contact with the dispenser. By requiring such physical conduct, the dispenser becomes a medium for transferring bacteria and disease to subsequent users. Automated dispensers have rectified this problem by eliminating the need for physical contact between users and a dispenser. As a result, automated dispensers reduce the potential for a user contracting a healthcare-acquired infection by eliminating the need for physical contact with dispensers. Turning again now to manual dispensers, it is well known that healthcare workers using such dispensers generally perform only a partial dispense. In other words, they fail to obtain the recommended dispensing volume of soap or alcohol making the hand cleansing less effective. Automated dispensers have again remedied this problem, as automated dispensers commonly utilize electrical motors capable of dispensing the appropriate volume of alcohol or soap for a given user. However, unlike manual dispensers, automated dispensers are often powered by standard batteries. As such, repeated use of automated dispensers results in a decrease in battery levels which has a direct effect on the efficiency of the electrical motor responsible for dispensing appropriate volumes of alcohol or soap.

While the discussion thus far has focused on manual and automated soap dispensers, the inadequacies stated above exist in manual and automated dispensers irrespective of whatever purpose they may serve. Even though automated dispensers are desirable in the sense that they require no physical contact between a user and the dispenser, they remain rather scarce in healthcare facilities due to their dependence on batteries as a source of power. Furthermore, from an economic viewpoint, the unavoidable costs associated with performing routine maintenance make automated dispensers an impractical candidate for widespread implementation. What is needed, therefore, is an automated dispenser which is no longer dependent on batteries as a power supply.

DISCLOSURE OF THE INVENTION

This disclosure sets forth embodiments for providing a system for powering and monitoring device utilization of a battery powered automated dispenser using a HHC system in conjunction with a pseudo battery assembly. The system includes a HHC system, which provides an offline electrical power supply to a plurality of control units located throughout a healthcare facility. Each control unit subsequently distributes the electrical power supply to a plurality of battery powered automated dispensers in close proximity to the control units using a pseudo battery assembly. The pseudo battery assembly, housed inside the battery powered automated dispenser, comprises an electrical circuit having a battery form factor (that is, a pseudo battery) and a plurality of battery spacers also having a battery form factor. More specifically, the pseudo battery is hard-wired to each control unit and supplies electrical power as well as a means for monitoring device utilization of the battery powered automated dispenser, while the battery spacers are intended to complete (i.e. create a closed loop) the electrical circuit. As such, the battery spacers are not operable to provide the battery powered automated dispenser a source of power or detect device utilization.

In one embodiment, the HHC system in conjunction with the pseudo battery assembly powers and monitors device utilization of a battery powered automated soap dispenser. The pseudo battery powers sensors, such as infrared sensors, on the automated soap dispenser for purposes of detecting the presence of a user in close proximity. When the infrared sensors detect the presence of a user in close proximity to the automated soap dispenser, an electrical motor actuates resulting in an increase in demand for electrical power to dispense an appropriate volume of soap. As such, the pseudo battery is operable to monitor the aforementioned increase in electrical power as a means for communicating device utilization (i.e. user washing hands) to a control unit in close proximity to the batter powered automated soap dispenser.

In another embodiment, the HHC system in conjunction with the pseudo battery assembly powers and monitors device utilization of a battery powered automated gloves dispenser. The pseudo battery powers sensors on the automated gloves dispenser for purposes of detecting the presence of a user in close proximity. The sensors detecting the presence of a user in close proximity to the automated gloves dispenser causes an electrical motor to actuate resulting in an increased demand in power to dispense gloves. The pseudo battery is operable to monitor the aforementioned increase in power as a means for communicating device utilization (i.e. user obtaining gloves) to a control unit in proximity to the battery powered automated gloves dispenser.

In yet another embodiment, the HHC system in conjunction with the pseudo battery assembly powers and monitors device utilization of a battery powered automated towel dispenser. The pseudo battery powers sensors on the automated towel dispenser for purposes of detecting presence of a user in close proximity. The sensors detecting the presence of a user in close proximity to the automated towel dispenser causes an electrical motor to actuate resulting in an increased demand in power to dispense towels. The pseudo battery is operable to detect the aforementioned increase in power to dispense towels. The pseudo battery is operable to detect the aforementioned increase in power as a means for detecting device utilization (i.e. user obtaining towels).

These and other embodiments will become readily apparent to those skilled in the art from the following detailed description of the embodiments having reference to the attached figures, the invention not being limited to any particular embodiment(s) disclosed.

BEST MODE FOR CARRYING OUT INVENTION

Figure 1:
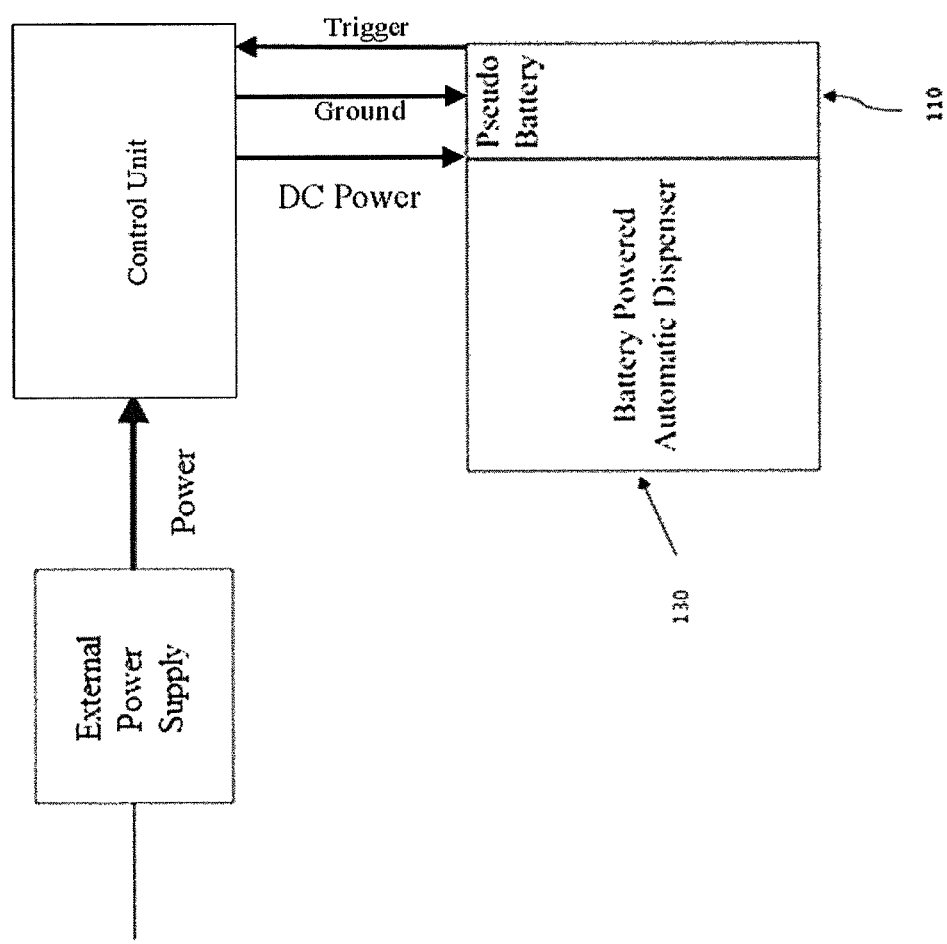
FIG. 1 depicts the electrical power distribution from the HHC system to the battery powered automated dispenser using the pseudo battery assembly
Figure 2:
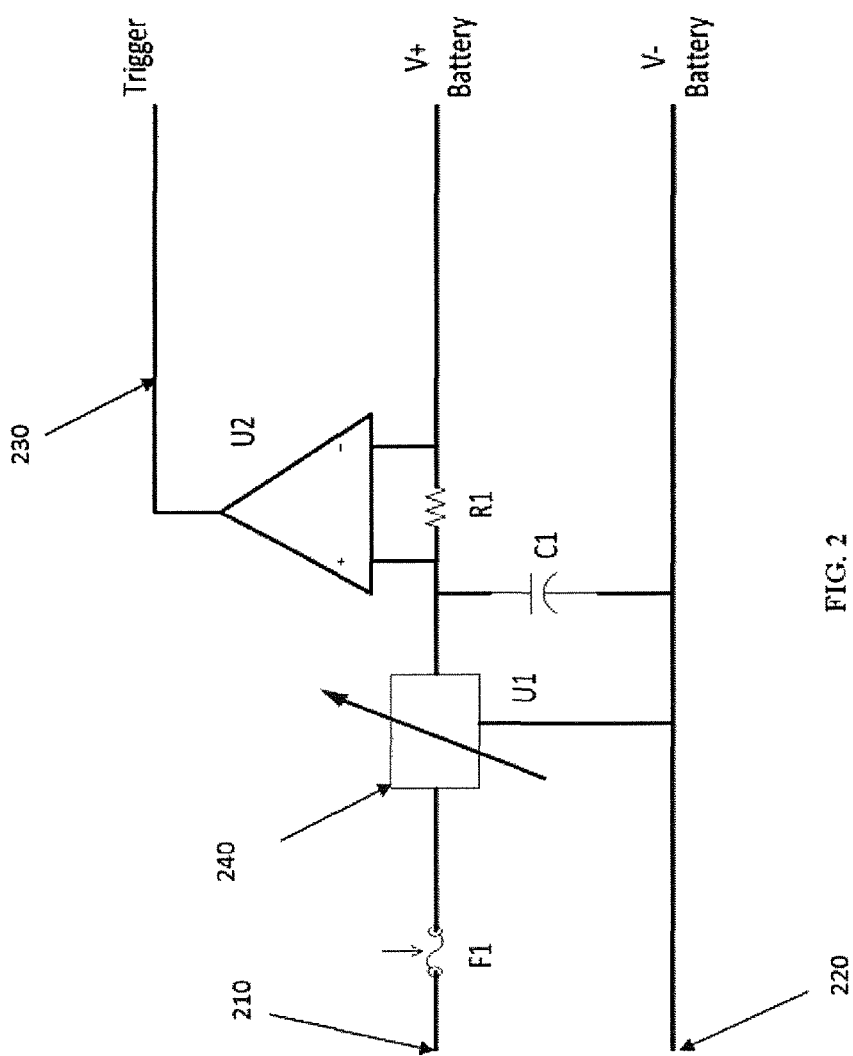
FIG. 2 is an exemplary embodiment of an electrical circuit contained within in the pseudo battery
Figure 3:
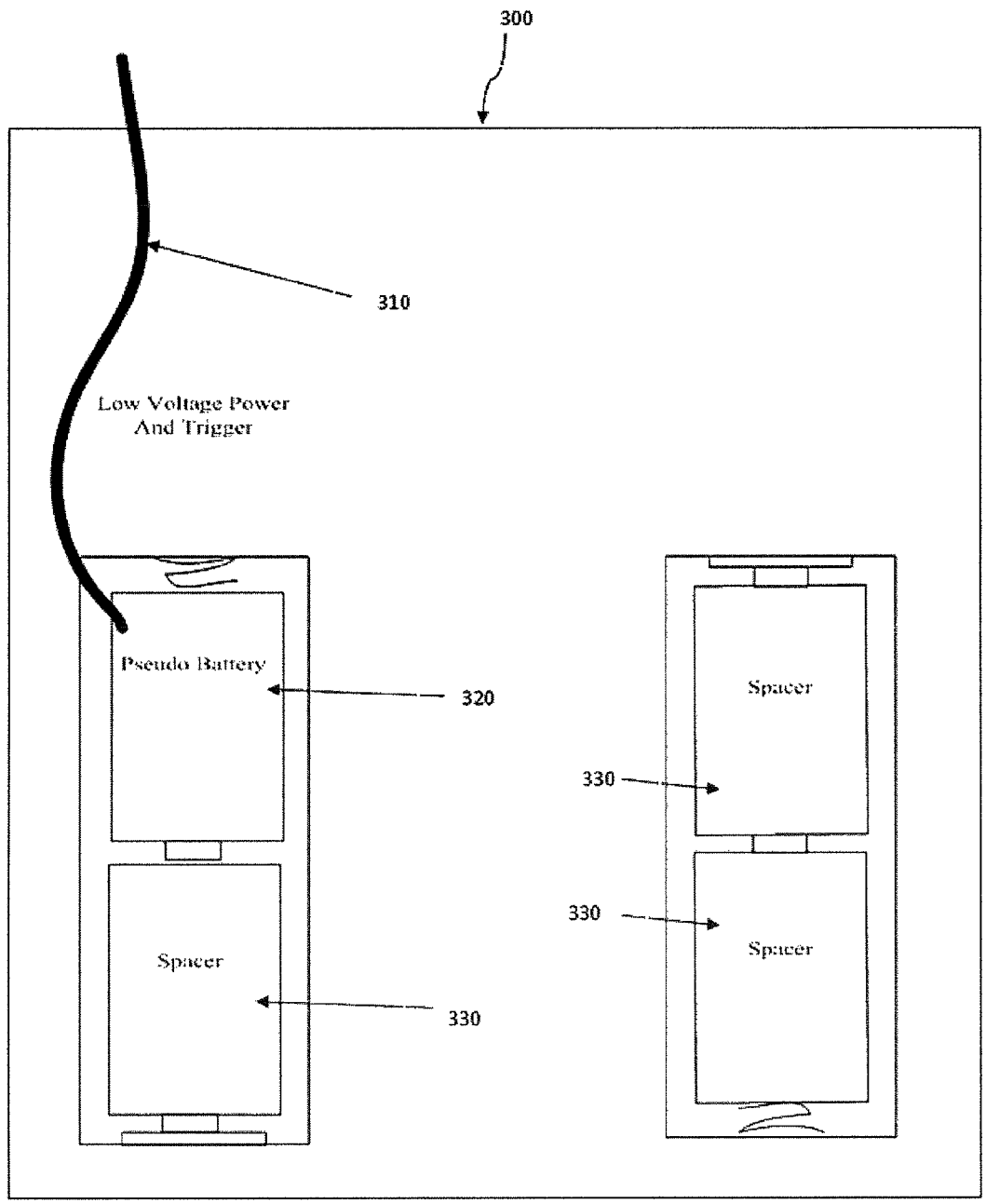
FIG. 3 is an exemplary embodiment of the pseudo battery assembly powering and monitoring device utilization of a battery powered automated dispenser.
Figure 3A:
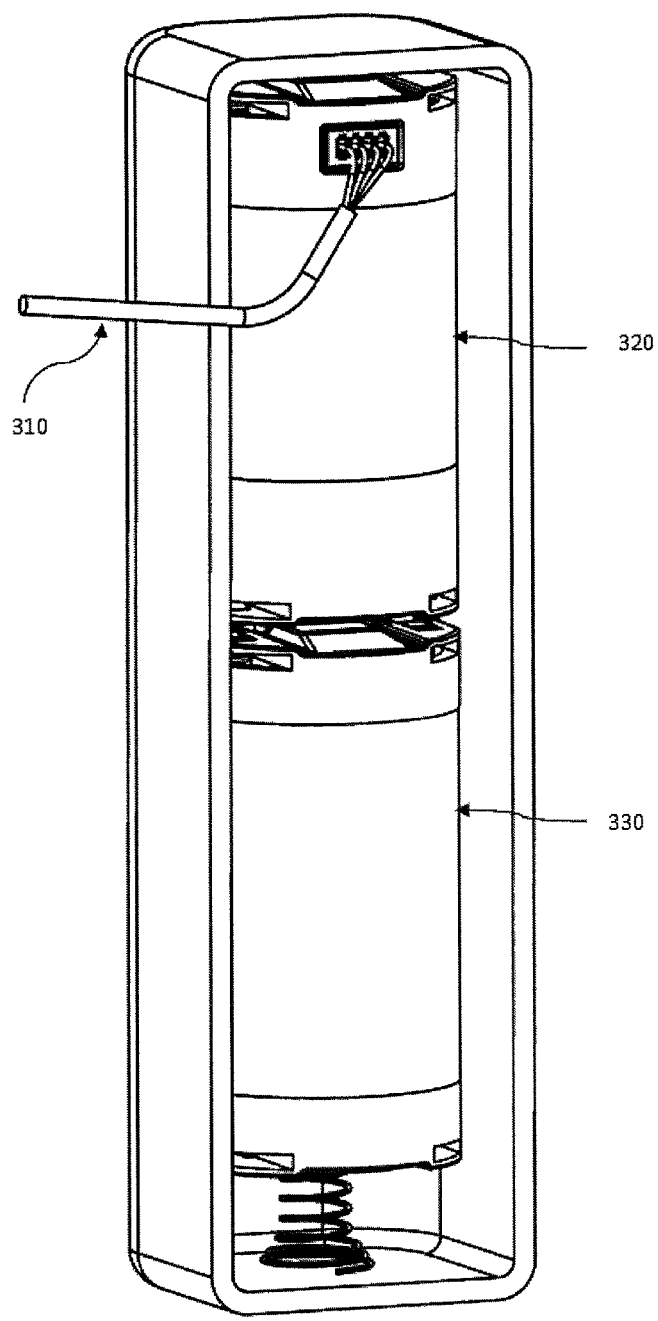
FIG. 3A is a perspective view of an embodiment of a pseudo battery assembly installed in a battery compartment of a battery powered automated dispenser (not shown).

The various embodiments and their advantages may be understood by referring to FIGS. 1 through 3 of the attached drawings. The elements of the drawings are not necessarily to scale, emphasis instead being placed upon illustrating the principles of preferred embodiments, which may be provided in other specific forms and embodiments without departing from the essential characteristics as described herein. The embodiments described below are to be considered in all aspects as illustrative only and not restrictive in any matter.

This disclosure relates to a system comprising hand hygiene compliance (HHC) system which further comprises a plurality of control units in conjunction with a pseudo battery assembly, and a plurality of battery powered automated dispensers. The HHC system provides an offline electrical power supply to the control units located throughout a healthcare facility. Each control unit distributes the electrical power supply to automated dispensers in close proximity using the pseudo battery assembly whereby the pseudo battery assembly powers and monitors device utilization of the battery powered automated dispenser.

As used herein, the term "automated dispenser" broadly refers to any battery powered automated dispenser operable to dispense a supply, soap, or alcohol based sanitizer. Further, the basic components and operation of an HHC system are known to those of ordinary skill in the art and will not be described in detail here.

Referring now to FIGS. 1, 2, and 3 in conjunction, a control unit (100) receives electrical power from a wall outlet in proximity to the control unit and further distributes electrical power received from the wall outlet to a pseudo battery assembly (110) housed inside an automated dispenser (130). The pseudo battery assembly (110) comprises an electrical circuit, an exemplary embodiment of which is shown in FIG. 2, which has a standard battery form factor and is hereinafter referred to as a pseudo battery (320) as depicted in FIG. 3 along with a plurality of battery spacers (330) also having a battery form factor. In one embodiment, the pseudo battery (320) is hard-wired to the control unit (110) by three electrical wires comprising: a power wire (210), a ground wire (220), and a trigger wire (230). The power wire (210) delivers a low voltage direct current (LVDC) flowing from the control unit (110) to a voltage regulator (240) contained within the pseudo battery (320). The voltage regulator (240) serves as a means for regulating the LVDC entering the pseudo battery (320). Once the voltage regulator (240) converts the LVDC to a voltage within an appropriate range, the pseudo battery (320) allocates electrical power as necessary to power sensors responsible for detecting proximity of a user to the automated dispenser (130). As such, a user in proximity to the automated dispenser (130) causes an electrical motor, not depicted, to actuate requiring an increased demand on the amount of electrical power the pseudo battery (310) provides the automated dispenser (130). When this occurs, the trigger wire (230) communicates the increase in electrical power drawn from the pseudo battery (320) to the control unit (110) as a means for monitoring device utilization. More specifically, the trigger wire (230) allows the control unit (110) to more accurately monitor dispenses for purposes of generating alarms or notifications on a feedback device associated with the control unit (110) indicating any necessary maintenance on the automated dispenser (130). For example, the trigger wire (230) monitoring device utilization of an automated soap dispenser may prompt the control unit (110) to display an alarm or notification reminding hospital employees to replenish the supply of soap as a response to exceeding a predetermined threshold of device utilizations.

Referring now to FIG. 3 exclusively, an exemplary embodiment of a pseudo battery assembly (300) is shown. In this exemplary embodiment, an electrical wire (310) originating from a control unit connects to a pseudo battery assembly (300). More specifically, an electrical circuit having a battery form factor, that is, a pseudo battery (320) is hard-wired to the control unit. As such, the pseudo battery (320) provides a source of power for an automated dispenser housing the pseudo battery assembly (300). Furthermore, the pseudo battery assembly (300) also contains a plurality of battery spacers (330) having a battery form factor for purposes of closing the circuit. In this exemplary embodiment, the pseudo battery assembly (300) has replaced four batteries.

While the above exemplary embodiments have been disclosed for purposes of illustration, it is obvious that many modifications and variations could be made thereto.

It is claimed:

1. A method comprising:
installing a pseudo battery assembly in a battery-powered automated dispenser;
distributing power from an external power source to the pseudo battery assembly, wherein the pseudo battery assembly is operable to supply power to the dispenser; and
detecting use of the dispenser by a person based upon a signal that is generated by the pseudo battery assembly in response to the pseudo battery assembly supplying electrical power to actuate an electric motor of the dispenser.

2. The method of claim 1, wherein the pseudo battery assembly further comprises a pseudo battery and a plurality of battery spacers.

3. The method of claim 2, wherein the pseudo battery and each of the plurality of battery spacers have a standard battery form factor.

4. The method of claim 1, wherein the automated dispenser is selected from the group consisting of: an automated gloves dispenser, an automated hand hygiene dispenser, or an automated towel dispenser.

5. The method of claim 1, wherein the pseudo battery assembly includes a sensor that is operable to detect distribution of power to the dispenser.

6. The method of claim 1, wherein the external power source is a control unit that is associated with the dispenser and powered by an offline power supply.

7. The method of claim 6, further comprising displaying on a feedback device associated with the control unit an alarm or notification once the dispenser has been used a predetermined number of times.

8. A system comprising:
a control unit comprising a power supply;
a pseudo battery assembly receiving power from said power supply, said pseudo battery comprising a pseudo battery and a plurality of battery spacers and being adapted to fit into a battery compartment of a battery-powered automated dispenser and supply power thereto;
wherein said control unit receives a signal from said pseudo battery assembly in response to said pseudo battery assembly supplying electrical power to actuate an electric motor of said battery-powered automated dispenser.

9. The system of claim 8, wherein the pseudo battery and each of the plurality of battery spacers have a standard battery form factor.

10. The system of claim 8, wherein the automated dispenser is selected from the group consisting of: an automated gloves dispenser, an automated hand hygiene dispenser, or an automated towel dispenser.

11. The system of claim 8, wherein said control unit comprises a feedback device, said feedback device being operable to display an alarm or notification once the dispenser has been used a predetermined number of times.

12. The system of claim 8, wherein said control unit is part of hand hygiene compliance system.

13. A method comprising:
powering a battery-powered automated dispenser with a pseudo-battery assembly; and
communicating a signal from the pseudo-battery assembly in response to the pseudo-battery assembly supplying electrical power to actuate an electric motor of the battery-powered automated dispenser.

* * * * *